US009614713B1

(12) United States Patent
Dias et al.

(10) Patent No.: US 9,614,713 B1
(45) Date of Patent: Apr. 4, 2017

(54) TRANSMIT AMPLITUDE AND PHASE MODULATION BASED ON TWO CONSTANT-AMPLITUDE PHASORS

(71) Applicant: Intel IP Corporation, Santa Clara, CA (US)

(72) Inventors: Victor Da Fonte Dias, Neubiberg (DE); Giuseppe Li Puma, Bochum (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/064,020

(22) Filed: Mar. 8, 2016

(51) Int. Cl.
*H04L 27/36* (2006.01)
*H03C 5/00* (2006.01)
*H04B 1/04* (2006.01)

(52) U.S. Cl.
CPC ............ *H04L 27/361* (2013.01); *H03C 5/00* (2013.01); *H04B 1/04* (2013.01); *H03C 2200/0058* (2013.01)

(58) Field of Classification Search
CPC ....... H04L 27/361; H04L 27/20; H04L 27/22; H03C 5/00; H03C 2200/0058; H04B 1/04; H03M 1/822; H03M 1/74; H03M 1/68
USPC ........................................ 375/295, 297, 298
See application file for complete search history.

(56) References Cited

U.S. PATENT DOCUMENTS

| | | | | |
|---|---|---|---|---|
| 2015/0049840 A1* | 2/2015 | Banin | ...................... | H03M 1/66 375/297 |
| 2015/0091384 A1* | 4/2015 | Madoglio | ............... | H02J 17/00 307/104 |
| 2015/0156044 A1* | 6/2015 | Madoglio | ............... | H04L 27/22 375/219 |
| 2015/0181643 A1* | 6/2015 | Lakdawala | .............. | H04B 7/06 375/299 |
| 2015/0188583 A1* | 7/2015 | Ravi | ..................... | H04B 1/0475 375/296 |
| 2016/0173118 A1* | 6/2016 | Mayer | ...................... | H03M 1/12 375/328 |

OTHER PUBLICATIONS

Pinal, Pere Lluis Gilabert. "Multi Look-Up Table Digital Predistortion for RF Power Amplifier Linearization." Universitat Politecnica de Catalunya. Barcelona, Dec. 2007. 23 pages.

* cited by examiner

*Primary Examiner* — Freshteh N Aghdam
(74) *Attorney, Agent, or Firm* — Eschweiler & Potashnik, LLC (57) ABSTRACT

Techniques for generating signals based on two constant amplitude phasors are discussed. One example apparatus includes phase calculation circuitry that generates first and second angles from a representation of a complex signal; distributor circuitry that receives the second angle and outputs a positive and a negative version of it; a first signal generator configured that receives the first angle and one of the positive or the negative version and generates a first signal based on the first angle and the one of the positive or the negative version; a second signal generator that receives the first angle and the other of the positive or the negative version and generates a second signal based on the first angle and the other of the positive or the negative version; and a combiner that combines the first and the second signal and generates an output signal equivalent to the complex signal.

25 Claims, 7 Drawing Sheets

Example UE

TRANSMIT AMPLITUDE AND PHASE MODULATION BASED ON TWO CONSTANT-AMPLITUDE PHASORS

FIELD

The present disclosure relates to wireless technology, and more specifically to techniques for transmit amplitude and phase modulation based on a combination of two phasors.

BACKGROUND

Modern transceivers in wireless communication standards (e.g., cellular, connectivity, etc.) implement transmitters with architecture belonging to a restricted number of alternative classes. As one example, communication standards with constant amplitude modulation schemes (e.g., plain vanilla GSM (Global System for Mobile communications)) use mainly the sigma-delta PLL (Phase Locked Loop) loop architecture, but also the straightforward Cartesian architecture (also referred to as I&Q (in-phase (I) and quadrature (Q)) architecture). As another example, communication standards requiring higher transmission data rates and, consequently, a more efficient usage of the frequency spectrum (e.g., OFDM (Orthogonal Frequency Division Multiplexing), rely on modulation schemes with both amplitude and phase modulation. In the latter cases, the most used transmitter architectures are the Cartesian (I&Q) and the so-called polar modulation architecture.

In all these communication standards, the baseband signal to be transmitted is complex in nature—that is, it is composed of a sequence of samples with a real and an imaginary part. Put simply, each sample of the signal to be transmitted is for all purposes equivalent to the coordinates of a point in a two dimensional plane. The alternative transmitter architectures correspond, then, to alternative ways of expressing these same coordinates.

DETAILED DESCRIPTION

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Figure 1:
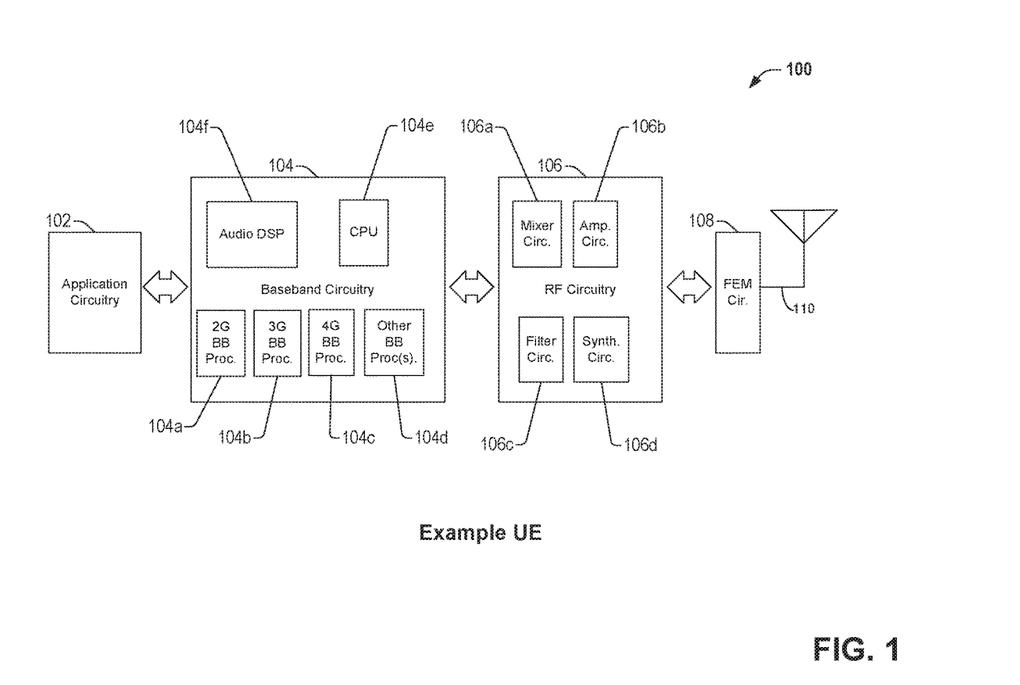
FIG. 1 is a block diagram illustrating an example user equipment (UE) useable in connection with various aspects described herein.

Embodiments described herein may be implemented into a system using any suitably configured hardware and/or software. FIG. 1 illustrates, for one embodiment, example components of a User Equipment (UE) device 100. In some embodiments, the UE device 100 may include application circuitry 102, baseband circuitry 104, Radio Frequency (RF) circuitry 106, front-end module (FEM) circuitry 108 and one or more antennas 110, coupled together at least as shown.

The application circuitry 102 may include one or more application processors. For example, the application circuitry 102 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage and may be configured to execute instructions stored in the memory/storage to enable various applications and/or operating systems to run on the system.

The baseband circuitry 104 may include circuitry such as, but not limited to, one or more single-core or multi-core processors. The baseband circuitry 104 may include one or more baseband processors and/or control logic to process baseband signals received from a receive signal path of the RF circuitry 106 and to generate baseband signals for a transmit signal path of the RF circuitry 106. Baseband processing circuitry 104 may interface with the application circuitry 102 for generation and processing of the baseband signals and for controlling operations of the RF circuitry 106. For example, in some embodiments, the baseband circuitry 104 may include a second generation (2G) baseband processor 104a, third generation (3G) baseband processor 104b, fourth generation (4G) baseband processor 104c, and/or other baseband processor(s) 104d for other existing generations, generations in development or to be developed in the future (e.g., fifth generation (5G), 6G, etc.). The baseband circuitry 104 (e.g., one or more of baseband processors 104a-d) may handle various radio control functions that enable communication with one or more radio networks via the RF circuitry 106. The radio control functions may include, but are not limited to, signal modulation/demodulation, encoding/decoding, radio frequency shifting, etc. In some embodiments, modulation/demodulation circuitry of the baseband circuitry 104 may include Fast-Fourier Transform (FFT), precoding, and/or constellation mapping/demapping functionality. In some embodiments, encoding/decoding circuitry of the baseband circuitry 104 may include convolution, tail-biting convolution, turbo, Viterbi, and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 104 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) 104e of the baseband circuitry 104 may be configured to run elements of the protocol stack for signaling of the PHY, MAC, RLC, PDCP and/or RRC layers. In some embodiments, the baseband circuitry may include one or more audio digital signal processor(s) (DSP) 104f. The audio DSP(s) 104f may include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 104 and the application circuitry 102 may be implemented together such as, for example, on a system on a chip (SOC).

In some embodiments, the baseband circuitry 104 may provide for communication compatible with one or more radio technologies. For example, in some embodiments, the baseband circuitry 104 may support communication with an evolved universal terrestrial radio access network (EUTRAN) and/or other wireless metropolitan area networks (WMAN), a wireless local area network (WLAN), a wireless personal area network (WPAN). Embodiments in which the baseband circuitry 104 is configured to support radio communications of more than one wireless protocol may be referred to as multi-mode baseband circuitry.

RF circuitry 106 may enable communication with wireless networks using modulated electromagnetic radiation through a non-solid medium. In various embodiments, the RF circuitry 106 may include switches, filters, amplifiers, etc. to facilitate the communication with the wireless network. RF circuitry 106 may include a receive signal path which may include circuitry to down-convert RF signals received from the FEM circuitry 108 and provide baseband signals to the baseband circuitry 104. RF circuitry 106 may also include a transmit signal path which may include circuitry to up-convert baseband signals provided by the baseband circuitry 104 and provide RF output signals to the FEM circuitry 108 for transmission.

In some embodiments, the RF circuitry 106 may include a receive signal path and a transmit signal path. The receive signal path of the RF circuitry 106 may include mixer circuitry 106a, either as multiplication of signals or as a sampling of the signal, amplifier circuitry 106b and filter circuitry 106c. The transmit signal path of the RF circuitry 106 may include filter circuitry 106c and mixer circuitry 106a. RF circuitry 106 may also include synthesizer circuitry 106d for synthesizing a frequency for use by the mixer circuitry 106a of the receive signal path and the transmit signal path. In some embodiments, the mixer circuitry 106a of the receive signal path may be configured to down-convert RF signals received from the FEM circuitry 108 based on the synthesized frequency provided by synthesizer circuitry 106d. The amplifier circuitry 106b may be configured to amplify the down-converted signals and the filter circuitry 106c may be a low-pass filter (LPF) or band-pass filter (BPF) configured to remove unwanted signals from the down-converted signals to generate output baseband signals.

Output baseband signals may be provided to the baseband circuitry 104 for further processing. In some embodiments, the output baseband signals may be zero-frequency baseband signals, although this is not a requirement. In some embodiments, mixer circuitry 106a of the receive signal path may comprise passive mixers, although the scope of the embodiments is not limited in this respect.

In some embodiments, the mixer circuitry 106a of the transmit signal path may be configured to up-convert input baseband signals based on the synthesized frequency provided by the synthesizer circuitry 106d to generate RF output signals for the FEM circuitry 108. The baseband signals may be provided by the baseband circuitry 104 and may be filtered by filter circuitry 106c. The filter circuitry 106c may include a low-pass filter (LPF), although the scope of the embodiments is not limited in this respect.

In some embodiments, the mixer circuitry 106a of the receive signal path and the mixer circuitry 106a of the transmit signal path may include two or more mixers and may be arranged for quadrature down conversion and/or up conversion respectively. In some embodiments, the mixer circuitry 106a of the receive signal path and the mixer circuitry 106a of the transmit signal path may include two or more mixers and may be arranged for image rejection (e.g., Hartley image rejection). In some embodiments, the mixer circuitry 106a of the receive signal path and the mixer circuitry 106a may be arranged for direct down conversion and/or direct up conversion, respectively. In some embodiments, the mixer circuitry 106a of the receive signal path and the mixer circuitry 106a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 106 may include analog-to-digital converter (ADC) and digital-to-analog converter (DAC) circuitry and the baseband circuitry 104 may include a digital baseband interface to communicate with the RF circuitry 106.

In some dual-mode embodiments, a separate radio IC circuitry may be provided for processing signals for each spectrum, although the scope of the embodiments is not limited in this respect.

In some embodiments, the synthesizer circuitry 106d may be a fractional-N synthesizer or a fractional N/N+1 synthesizer, although the scope of the embodiments is not limited in this respect as other types of frequency synthesizers may be suitable. For example, synthesizer circuitry 106d may be a delta-sigma synthesizer, a frequency multiplier, or a synthesizer comprising a phase-locked loop with a frequency divider.

The synthesizer circuitry 106d may be configured to synthesize an output frequency for use by the mixer circuitry 106a of the RF circuitry 106 based on a frequency input and a divider control input. In some embodiments, the synthesizer circuitry 106d may be a fractional N/N+1 synthesizer.

In some embodiments, frequency input may be provided by a voltage controlled oscillator (VCO), although that is not a requirement. Divider control input may be provided by either the baseband circuitry 104 or the applications processor 102 depending on the desired output frequency. In some embodiments, a divider control input (e.g., N) may be determined from a look-up table based on a channel indicated by the applications processor 102.

Synthesizer circuitry 106d of the RF circuitry 106 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 106d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 106 may include an IQ/polar converter.

FEM circuitry 108 may include a receive signal path which may include circuitry configured to operate on RF signals received from one or more antennas 110, amplify the received signals and provide the amplified versions of the received signals to the RF circuitry 106 for further processing. FEM circuitry 108 may also include a transmit signal path which may include circuitry configured to amplify signals for transmission provided by the RF circuitry 106 for transmission by one or more of the one or more antennas 110.

In some embodiments, the FEM circuitry 108 may include a TX/RX switch to switch between transmit mode and receive mode operation. The FEM circuitry may include a receive signal path and a transmit signal path. The receive signal path of the FEM circuitry may include a low-noise amplifier (LNA) to amplify received RF signals and provide the amplified received RF signals as an output (e.g., to the RF circuitry 106). The transmit signal path of the FEM circuitry 108 may include a power amplifier (PA) to amplify input RF signals (e.g., provided by RF circuitry 106), and one or more filters to generate RF signals for subsequent transmission (e.g., by one or more of the one or more antennas 110.

In some embodiments, the UE device 100 may include additional elements such as, for example, memory/storage, display, camera, sensor, and/or input/output (I/O) interface.

Various embodiments disclosed herein can facilitate selective operation of one or more UEs (or other mobile devices) in a FD mode of operation to efficiently employ FD mode in appropriate situations, and employ a half-duplex mode (e.g., FDD or TDD) in situations in which the FD mode is not appropriate.

In various aspects, techniques disclosed herein can facilitate transmit amplitude and phase modulation based on a combination of two constant amplitude phasors. In one example embodiment, a pair of angles can be determined from a representation of a complex signal, wherein the complex signal is equivalent to the sum of two constant amplitude phasors, one having a phase equal to the sum of the pair of the angles, and the other having a phase equal to the difference of the pair of angles. These phasors can be generated and combined to output the complex signal.

Figure 2:
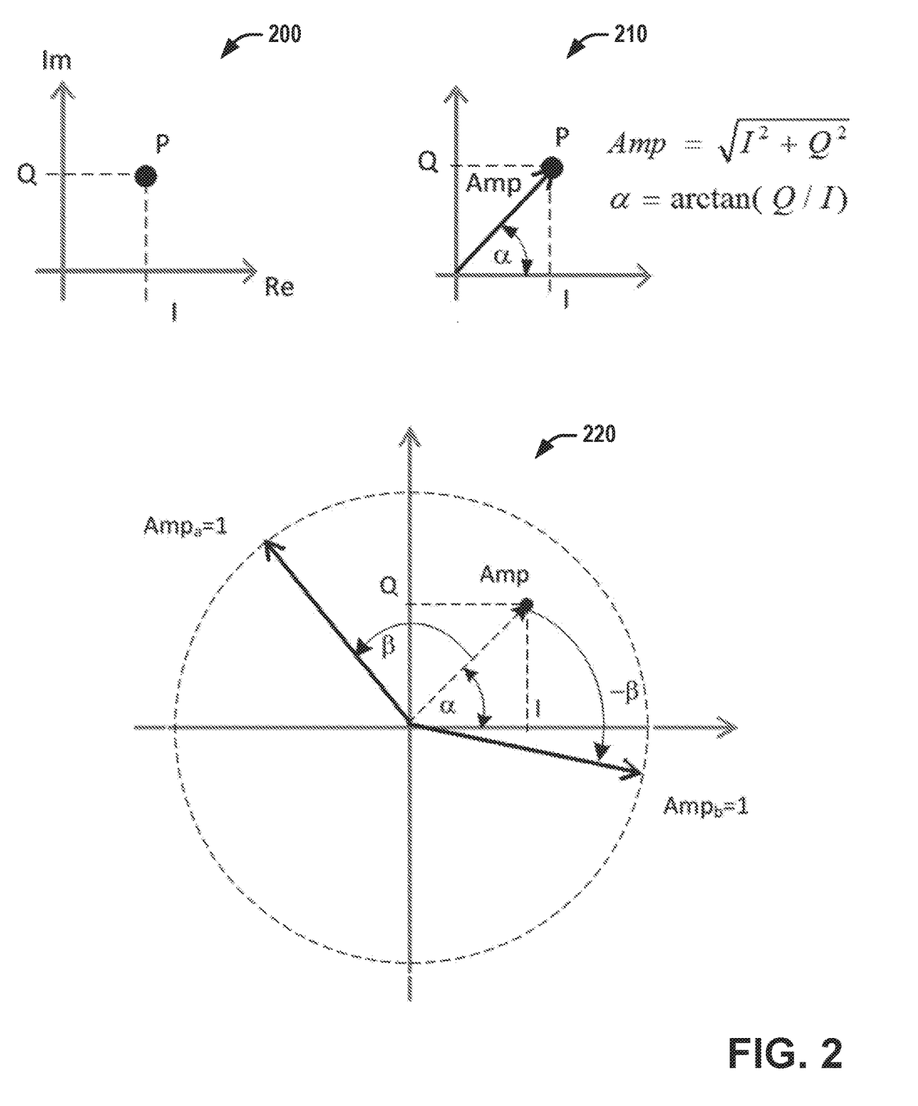
FIG. 2 is a diagram illustrating various techniques for representing a point in a complex plane, including a Cartesian representation, a polar representation, and a representation based on two constant amplitude phasors employed in various aspects described herein.

Referring to FIG. 2, illustrated are three representations of a point in a complex plane: a Cartesian representation at 200, a polar representation at 210, and a representation 220 based on the sum of two constant amplitude phasors employed in various aspects described herein.

In a communication standard with a constant amplitude modulation scheme, the coordinates to be synthesized are all located in a circle of constant amplitude centered around the (0,0) coordinate. Because of this, a simple PLL with phase modulation is enough to generate the desired radio frequency waveform. Examples of modern implementations of constant amplitude phase modulators are those based on sigma-delta PLL loops as well as those based on Digital-to-Time Converters (DTC).

In communication standards with amplitude and phase modulation, the coordinates to be synthesized cover a two dimensional space around the center (0,0). These coordinates can be expressed as Cartesian coordinates as in 200 (i.e, with real and imaginary parts) or as polar coordinates as in 210, shown in 210 with an amplitude and a phase variable. Modern implementations of polar modulators include those based on Digital-to-Time Converters (DTC, for the phase modulation) and Digital-to-Analogue Converters (for the amplitude modulation).

As a third alternative mapping (not illustrated in FIG. 2), the inventors have developed a class of hybrid architectures that combine the implementation benefits of both the Cartesian and polar modulation alternatives. In this hybrid implementations, the coordinates of the points in the two dimensional plane can be expressed based on combinations of Cartesian coordinates and one or even two phase coordinates. Such a representation has advantages which include increased accuracy with which the mapping of the complex plane can be achieved.

A fourth alternative mapping, shown at 220, is to express the coordinates of points of the complex plane as the combination of two constant amplitude phase modulated signals (i.e., two constant amplitude phasors (TOCAP)). No conventional implementations of this mapping exist in devices implementing modern digital communications wireless standards (e.g., within mobile phones, access points, etc.).

The varying architectures of transmitter encompass these alternative ways of expressing the coordinates of the point in the complex plane that corresponds to the signal. For simplicity in the following discussion, the plane is normalized, such that the real and imaginary components have a maximum of 1.

The TOCAP representation of 220 represents a point in the complex plane with Cartesian coordinates (I,Q) as the sum of two phasors, denoted a and b in 220, with the amplitudes and phases given per equation (1):

$$\text{Amp}_a = 1 \quad \delta_a = \alpha + \cos^{-1}(\sqrt{(I^2+Q^2)/2})$$

$$\text{Amp}_b = 1 \quad \delta_b = \alpha - \cos^{-1}(\sqrt{(I^2+Q^2)/2})$$

where $\alpha = \tan^{-1}(Q/I)$, and the second angle, $\cos^{-1}\sqrt{(I^2+Q^2)/2}$, is also referred to herein as $\beta$. It is to be appreciated that similar equations can be readily derived to express the angles $\alpha$ and $\beta$ in terms of other representations for the point, for example, in polar coordinates, given that $\sqrt{(I^2+Q^2)}$ is the amplitude of the point, and $\tan^{-1}(Q/I)$ is the phase.

Figure 3:
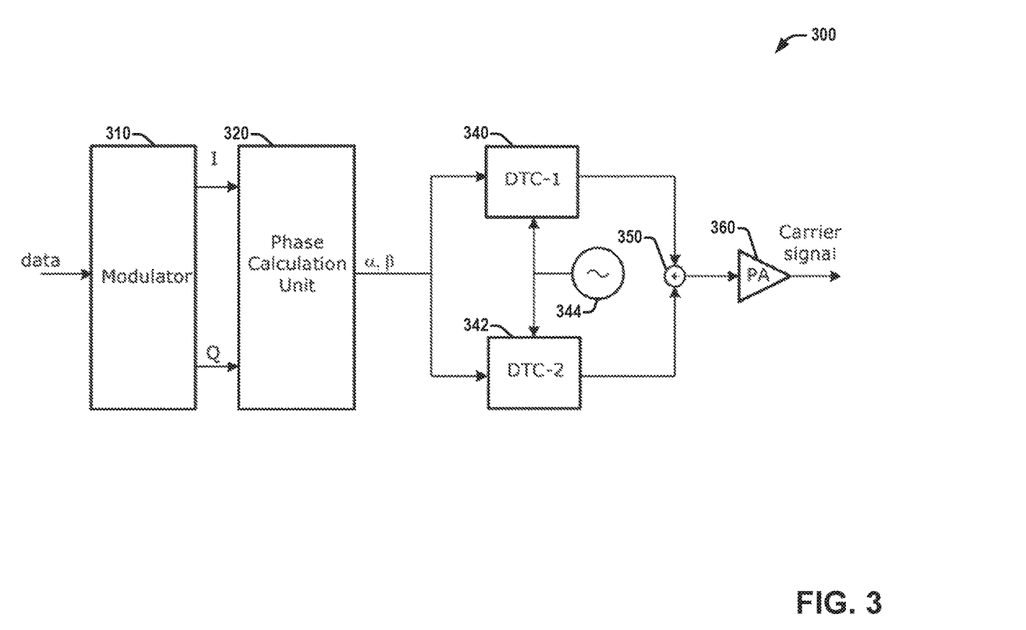
FIG. 3 is a block diagram of an example system configured to generate a carrier signal based on two constant amplitude phasors.

Referring to FIG. 3, illustrated is a block diagram of an example implementation of a system 300 employable in a transmitter to generate a complex signal based on two constant amplitude phasors. System 300 can include a modulator 310, a phase calculation unit 320, a pair of digital-to-time converters 340 and 342 that can receive a common signal from an oscillator 344, a combiner 350, and a power amplifier (PA) 360. System 300 can be employed in a transmitter within a user equipment (UE) or other mobile device, or within an Evolved Universal Terrestrial Radio Access Network (E-UTRAN) Node B (Evolved Node B, eNodeB, or eNB) or other base station in a wireless communications network.

In system 300, the modulator can receive a data stream for transmission, and can generate a representation of an associated complex signal, which in the example shown comprises in-phase (I) and quadrature (Q) signals based on that data stream. Phase calculation unit 320 can receive the representation and can generate first and second angles based on that representation, wherein one of the first angle or the second angle can correspond to the angle $\alpha$ discussed above in connection with equation (1), and the other of the first angle or the second angle can correspond to the angle $\beta$ discussed above in connection with equation (1). Phase calculation unit 320 can output the first and second angles to a pair of signal generators (such as DTCs 340 and 342), one of which can generate a signal with constant amplitude and phase of $\alpha+\beta$, and the other can generate a signal with the same constant amplitude and a phase of $\alpha-\beta$. Combiner 350 can combine the signals from the two signal generators to generate an output signal, and PA 360 can amplify the output signal.

Figure 4:
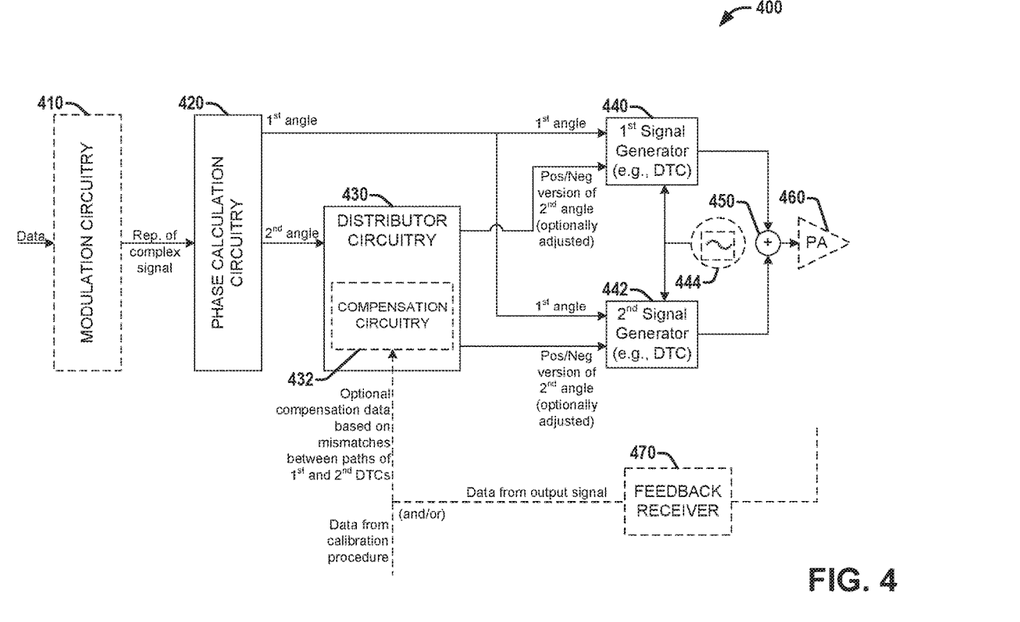
FIG. 4 is a block diagram of a system employable in a transmitter or other that facilitates generation of a complex signal based on two constant amplitude phasors according to various aspects described herein.

Referring to FIG. 4, illustrated is a block diagram of a system 400 employable in a transmitter or other that facilitates generation of a complex signal based on two constant amplitude phasors according to various aspects described herein. System 400 can comprise optional modulation circuitry 410, phase calculation circuitry 420, distributor circuitry 430 (which can comprise optional compensation circuitry 432), a pair of signal generators (e.g., DTCs, etc.) 440 and 442 that can receive a common signal from an optional oscillator 444, a combiner 450, an optional PA 460, and an optional feedback receiver 470.

When included, modulation circuitry 410 can receive an input data stream and can generate a representation (e.g., comprising I and Q signals, etc.) of a complex signal based on the input data stream.

Phase calculation circuitry 420 can receive the representation of the complex signal, and can generate a first angle and second angle based on the complex signal, wherein the first angle is one of $\alpha$ or $\beta$ discussed above in connection with equation (1), and the second angle is the other of $\alpha$ or $\beta$.

Distributor circuitry 430 can receive the second angle (either $\alpha$ or $\beta$) from the phase calculation circuitry and can generate a positive version of the second angle and a negative version of the second angle.

Distributor circuitry 430 can output the positive version to one of signal generators 440 and 442, and can output the negative version to the other of signal generators 440 and 442. The two paths associated with the first signal generator 440 and the second signal generator 442 can have non-ideal characteristics that could potentially lead to consistent errors if the positive version were always output to the same signal generator of signal generators 440 and 442. Thus, in various aspects, in each of a plurality of successive period (e.g., clock cycles, etc.), distributor circuitry 430 can select which signal generator of signal generators 440 and 442 to output the positive version to and which signal generator of signal generators 440 and 442 to output the negative version to, based on a redirection technique, which can compensate for and minimize the impact of such non-ideal characteristics. In various aspects, such a redirection technique can be based on one or more of an alternating pattern, a pseudo-random algorithm, etc. In some aspects, the redirection technique can be based at least in part on minimizing a variation from a previous angle (e.g., from an immediately prior period, etc.) output to the first signal generator 440, from a previous angle output to the second signal generator 442, or both (e.g., minimizing the sum of the two variations, etc.).

In embodiments comprising compensation circuitry 432, compensation circuitry 432 can adjust at least one of the positive version or the negative version to compensate for mismatches between the paths comprising signal generators 440 and 442 (e.g., mismatches in amplitude and/or phase of signals from the two paths, etc.). Compensation circuitry 432 can make these adjustments based on data obtained about the two paths from one or more of a calibration procedure (e.g., an initial factory calibration, field calibration, etc.), a feedback receiver 470 where included, etc.

Signal generator 440 and signal generator 442 can receive the first angle from phase calculation circuitry 420. Additionally, one signal generator (e.g., a selected signal generator) of signal generators 440 and 442 can receive from distributor circuitry 430 the positive version of the second angle (possibly adjusted by compensation, and the other signal generator of signal generators 440 and 442 can receive from distributor circuitry 430 the negative version of the second angle from distributor circuitry 430. Based on the received first angle and positive version or negative version of the second angle, each of signal generators 440 and 442 can generate a signal based on the received first angle and positive version or negative version. In various embodiments, the generated signal can be a phasor of constant amplitude with phase equal to either α+β (if that signal generator received the positive version) or α−β (if that signal generator received the negative version, potentially as adjusted by compensation circuitry 432 in embodiments including compensation circuitry 432.

Each of signal generator s 440 and 442 can output the signal (e.g., phasor) generated thereby to a combiner 450, which can combine (e.g., sum) the signals (e.g., the first signal received from signal generator 440 and the second signal received from signal generator 442) to obtain an output signal equivalent to the complex signal.

Where included, power amplifier 460 can amplify the output signal and output the amplified output signal (e.g., to an antenna port (not shown in FIG. 4) for transmission via one or more antennas (e.g., such as antenna(s) 110), etc.).

Figure 5:
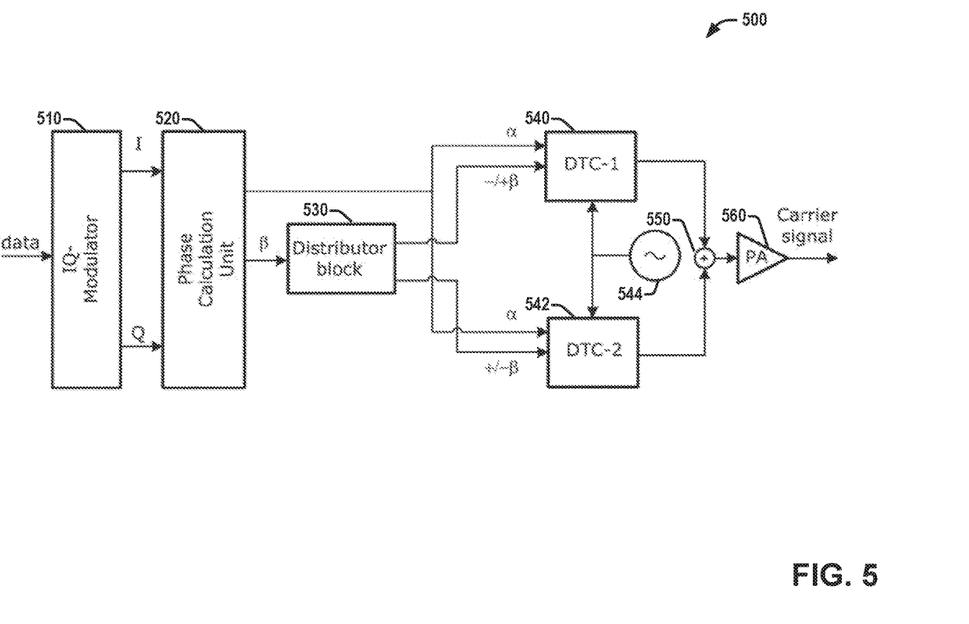
FIG. 5 is a block diagram of a first example of a system employable in a user equipment (UE) or other mobile terminal that facilitates generation of a complex signal based on two constant amplitude phasors according to various aspects described herein.

Referring to FIG. 5, illustrated is a block diagram of a first example of a system 500 employable in a user equipment (UE) or other mobile terminal that facilitates generation of a complex signal based on two constant amplitude phasors according to various aspects described herein. Example system 500 is one possible embodiment of system 400, comprising an IQ-modulator 510 (as an implementation of modulation circuitry 410), phase calculation unit 520 (as an implementation of phase calculation circuitry 420), distributor block 530 (as an implementation of distributor circuitry 430), first DTC 540 as a first signal generator, second DTC 542 as a second signal generator, local oscillator 544, combiner 550, and power amplifier 560.

In system 500, distributor block 530 is inserted in the path of the β (and −β) angle such that successive values of the β angle can be redirected to the desired DTC among DTCs 540 and 542. The redirection technique can be of many and varied types, for instance an alternating redirection to the top DTC 540 and to the bottom DTC 542 of the positive β value, a redirection according to a pseudo-random sequence, a redirection to minimize the variation of the angle(s) supplied to the same DTC(s) 540 and/or 542 in consecutive samples, etc. Redirection techniques such as those discussed herein can be used to spread non-idealities of the implementation of the blocks.

Figure 6:
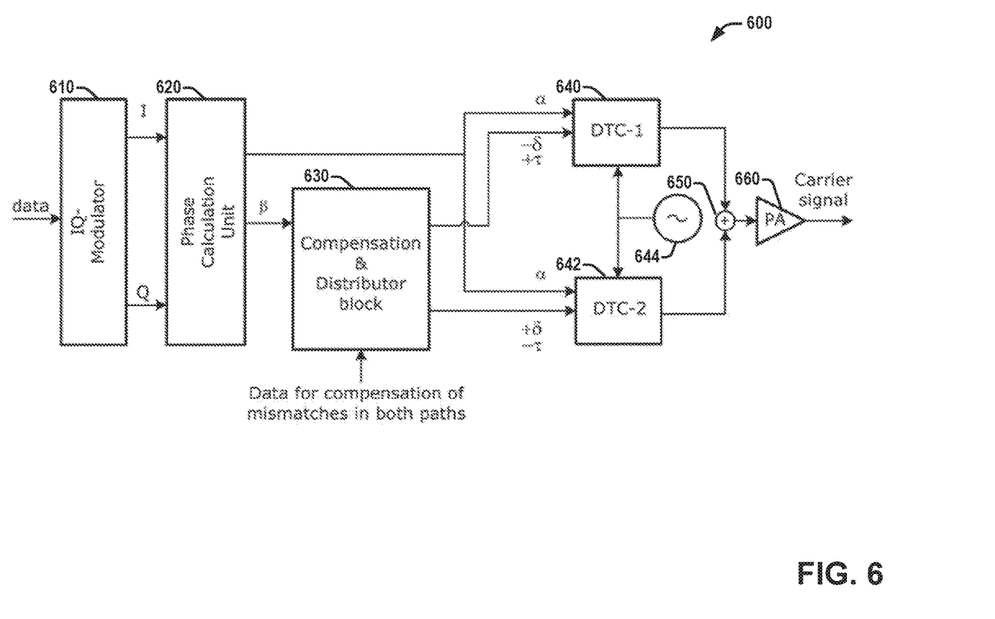
FIG. 6 is a block diagram of a second example of a system employable in a user equipment (UE) or other mobile terminal that facilitates generation of a complex signal based on two constant amplitude phasors according to various aspects described herein.

Referring to FIG. 6, illustrated is a block diagram of a second example of a system 600 employable in a user equipment (UE) or other mobile terminal that facilitates generation of a complex signal based on two constant amplitude phasors according to various aspects described herein. Example system 600 is one possible embodiment of system 400, comprising an IQ-modulator 610 (as an implementation of modulation circuitry 410), phase calculation unit 620 (as an implementation of phase calculation circuitry 420), compensation and distributor block 630 (as an implementation of distributor circuitry 430 and compensation circuitry 432), first DTC 640 as a first signal generator, second DTC 642 as a second signal generator, local oscillator 644, combiner 650, and power amplifier 660.

System 600 is an example embodiment of the TOCAP architecture with a more complex block (compensation and distributor block 630) inserted in the path of the β angle than in example system 500. In addition to the redistribution function described above in connection with distributor block 530, compensation and distributor block 630 can add/subtract small correction values to the β and −β angles, for example, to compensate for amplitude and phase mismatches in the paths between the combiner 650 and DTCs 640 and 642.

Figure 7:
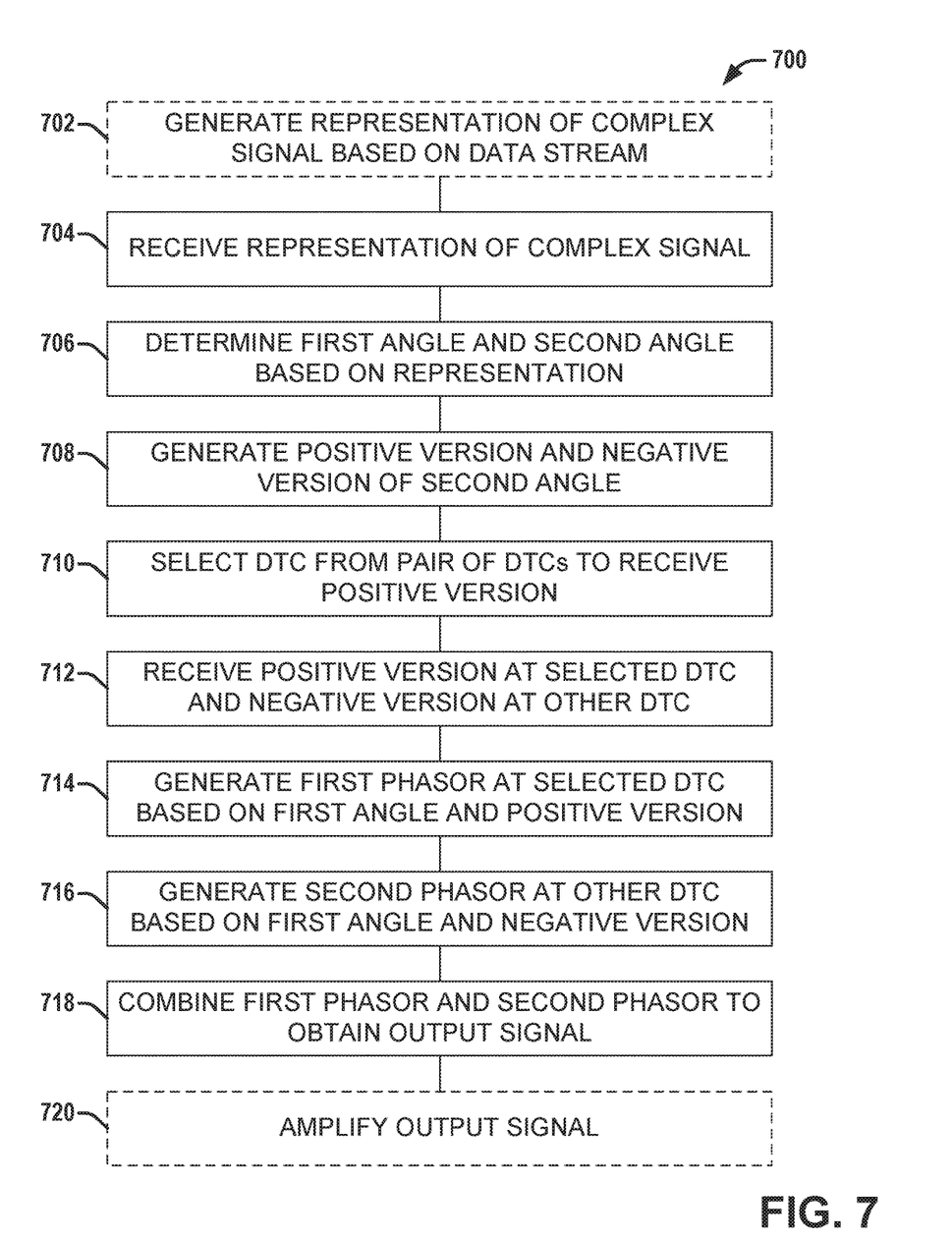
FIG. 7 is a flow diagram illustrating an example method of generating a complex signal based on a combination of two constant amplitude phasors according to various aspects described herein.

Referring to FIG. 7, illustrated is a flow diagram of an example method 700 of generating a complex signal based on a combination of two constant amplitude phasors according to various aspects described herein. In some aspects, method 700 can be performed at a transmitter (e.g., of a mobile device such as a UE or an access point such as an eNB, etc.). In other aspects, a machine readable medium can store instructions associated with method 700 that, when executed, can cause a transmitter to perform the acts of method 700.

Optionally, at 702, a representation of a complex signal can be generated based on an input data stream, such as an IQ (in-phase and quadrature) representation comprising an I signal and a Q signal, a polar representation, etc.

At 704, a representation of a complex signal can be received, which, in embodiments including 702, can be the representation generated at 702.

At 706, a first angle and a second angle (e.g., α and β as described above in connection with equation (1), etc.) can be determined based on the representation of the complex signal.

At 708, a positive version and a negative version of the second angle can be generated. In some aspects, at least one of the positive or the negative version can be adjusted, for example, to adjust for mismatches in phase and/or amplitude, such as mismatches between a pair of paths associated with a pair of DTCs or other signal generators. Such adjustments can be made based on data received via one or more of a calibration procedure, a feedback receiver, etc.

At 710, a DTC (or other signal generator) can be selected of a pair of DTCs (or pair of other signal generators), which can be, for example, the pair of DTCs (or pair of other signal generators) associated with mismatches in 708 in embodiments that adjust for such mismatches, etc.). The selected DTC (or other selected signal generator) can be selected based on a redirection technique, which can be based on one or more of an alternating pattern, a pseudo-random sequence, or minimization (e.g., of one or more of a variation from a previous angle output to the selected DTC (or other selected signal generator), a previous angle output to the other DTC (or other nonselected signal generator), a sum of variations from previous angles output to the pair of DTCs (or other signal generators), etc.). The redirection technique can minimize the impact of non-ideal characteristics associated with respective paths of the pair of DTCs (or pair of other signal generator).

At 712, the positive version of the second angle can be received at the selected DTC (or other selected signal generator), and the negative version can be received at the other DTC (or other nonselected signal generator) of the pair of DTCs (or other pair of signal generators).

At 714, a first phasor can be generated at the selected DTC (or other selected signal generator) based on the first angle and the positive version of the second angle (e.g., having a constant amplitude and a phase based on the sum of the first angle and the positive version of the second angle, etc.).

At 716, a second phasor can be generated at the other DTC (or other nonselected signal generator) based on the first angle and the negative version of the second angle (e.g., having the constant amplitude and a phase based on the sum of the first angle and the negative version of the second angle, etc.).

At 718, the first phasor and the second phasor can be combined (e.g., summed) to obtain an output signal equivalent to the complex signal.

Optionally, at 720, the output signal can be amplified (e.g., for eventual transmission, etc.).

Examples herein can include subject matter such as a method, means for performing acts or blocks of the method, at least one machine-readable medium including executable instructions that, when performed by a machine (e.g., a processor with memory, an application-specific integrated circuit (ASIC), a field programmable gate array (FPGA), or the like) cause the machine to perform acts of the method or of an apparatus or system for concurrent communication using multiple communication technologies according to embodiments and examples described.

Example 1 is an apparatus configured to be employed within a transmitter, comprising: phase calculation circuitry configured to receive a representation of a complex signal and to generate, based on the complex signal, a first angle and a second angle; distributor circuitry configured to receive the second angle from the phase calculation circuitry and to output a positive version of the second angle and a negative version of the second angle; a first signal generator configured to receive the first angle and one of the positive version or the negative version and to generate a first signal based on the first angle and the one of the positive version or the negative version; a second signal generator configured to receive the first angle and the other of the positive version or the negative version and to generate a second signal based on the first angle and the other of the positive version or the negative version; and a combiner configured to combine the first signal and the second signal to generate an output signal, wherein the output signal is equivalent to the complex signal.

Example 2 comprises the subject matter of example 1, wherein the distributor circuitry is configured to select, based on a redirection technique, whether to output the positive version to the first signal generator and the negative version to the second signal generator or to output the positive version to the second signal generator and the negative version to the first signal generator.

Example 3 comprises the subject matter of example 2, wherein the redirection technique is based at least in part on an alternating pattern.

Example 4 comprises the subject matter of example 2, wherein the redirection technique is based at least in part on a pseudo-random sequence.

Example 5 comprises the subject matter of example 2, wherein the redirection technique is based at least in part on minimizing one or more of: a first variation from a previous angle output to the first signal generator, a second variation from a previous angle output to the second signal generator, or a sum of the first variation and the second variation.

Example 6 comprises the subject matter of example 2, wherein at least one of a first path associated with the first signal generator and a second path associated with the second signal generator have non-ideal characteristics, wherein the redirection technique minimizes the impact of the non-ideal characteristics on the output signal.

Example 7 comprises the subject matter of example 1, wherein the distribution circuitry comprises compensation circuitry configured to adjust at least one of the positive version or the negative version to compensate for mismatches in at least one of phase or amplitude.

Example 8 comprises the subject matter of example 7, wherein the compensation circuitry is configured to adjust the at least one of the positive version or the negative version based at least in part on data received via a calibration procedure.

Example 9 comprises the subject matter of example 7, wherein the compensation circuitry is configured to adjust the at least one of the positive version or the negative version based at least in part on data received via a feedback receiver.

Example 10 comprises the subject matter of any of examples 1-9, including or omitting optional features, wherein the representation of the complex signal comprises an in-phase (I) signal and a quadrature (Q) signal.

Example 11 comprises the subject matter of any variation of example 10, further comprising 10-modulation circuitry configured to generate the I signal and the Q signal based on an input data stream.

Example 12 comprises the subject matter of example 1, further comprising a power amplifier (PA) configured to amplify the output signal.

Example 13 comprises the subject matter of example 1, wherein the representation of the complex signal comprises an in-phase (I) signal and a quadrature (Q) signal.

Example 14 comprises the subject matter of any of examples 2-3, including or omitting optional features, wherein the redirection technique is based at least in part on a pseudo-random sequence.

Example 15 comprises the subject matter of any of examples 2-3 or 14, including or omitting optional features, wherein the redirection technique is based at least in part on minimizing one or more of: a first variation from a previous angle output to the first signal generator, a second variation from a previous angle output to the second signal generator, or a sum of the first variation and the second variation.

Example 16 comprises the subject matter of any of examples 2-3 or 14-15, including or omitting optional features, wherein at least one of a first path associated with the first signal generator and a second path associated with the second signal generator have non-ideal characteristics, wherein the redirection technique minimizes the impact of the non-ideal characteristics on the output signal.

Example 17 comprises the subject matter of any of examples 1-3 or 14-16, including or omitting optional features, wherein the distribution circuitry comprises compensation circuitry configured to adjust at least one of the positive version or the negative version to compensate for mismatches in at least one of phase or amplitude.

Example 18 comprises the subject matter of any variation of example 17, wherein the compensation circuitry is configured to adjust the at least one of the positive version or the negative version based at least in part on data received via a calibration procedure.

Example 19 comprises the subject matter of any of examples 17-18, including or omitting optional features, wherein the compensation circuitry is configured to adjust the at least one of the positive version or the negative version based at least in part on data received via a feedback receiver.

Example 20 is a machine readable medium comprising instructions that, when executed, cause a user equipment (UE) to: receive a representation of a complex signal; determine a first angle and a second angle based on the complex signal; generate a positive version of the second angle and a negative version of the second angle; select a signal generator of a pair of signal generators; receive the positive version at the selected signal generator and the negative version at the other signal generator of the pair of signal generators; generate a first phasor at the selected signal generator based on the first angle and the positive version; generate a second phasor at the other signal generator based on the first angle and the negative version; and combine the first phasor and the second phasor to obtain an output signal equivalent to the complex signal.

Example 21 comprises the subject matter of example 20, wherein the instructions, when executed, cause the UE to select the signal generator based on a redirection technique.

Example 22 comprises the subject matter of example 21, wherein the redirection technique is based at least in part on an alternating pattern.

Example 23 comprises the subject matter of example 21, wherein the redirection technique is based at least in part on a pseudo-random sequence.

Example 24 comprises the subject matter of example 21, wherein the redirection technique is based at least in part on minimizing one or more of: a first variation from a previous angle output to the selected signal generator, a second variation from a previous angle output to the other signal generator, or a sum of the first variation and the second variation.

Example 25 comprises the subject matter of example 21, wherein at least one of a first path associated with the selected signal generator and a second path associated with the other signal generator have non-ideal characteristics, wherein the redirection technique minimizes the impact of the non-ideal characteristics on the output signal.

Example 26 comprises the subject matter of example 20, wherein the instructions, when executed, further cause the UE to adjust at least one of the positive version or the negative version to compensate for mismatches in at least one of phase or amplitude.

Example 27 comprises the subject matter of example 26, wherein the instructions, when executed, cause the UE to adjust the at least one of the positive version or the negative version based at least in part on data received via a calibration procedure.

Example 28 comprises the subject matter of example 26, wherein the instructions, when executed, cause the UE to adjust the at least one of the positive version or the negative version based at least in part on data received via a feedback receiver.

Example 29 comprises the subject matter of any of examples 20-28, including or omitting optional features, wherein the instructions, when executed, further cause the UE to generate the representation based on an input data stream, wherein the representation comprises an in-phase (I) signal and a quadrature (Q) signal.

Example 30 comprises the subject matter of example 20, wherein the instructions, when executed, further cause the UE to amplify the output signal.

Example 31 comprises the subject matter of example 20, wherein the instructions, when executed, further cause the UE to generate the representation based on an input data stream, wherein the representation comprises an in-phase (I) signal and a quadrature (Q) signal.

Example 32 comprises the subject matter of any of examples 21-23, including or omitting optional features, wherein the redirection technique is based at least in part on minimizing one or more of: a first variation from a previous angle output to the selected signal generator, a second variation from a previous angle output to the other signal generator, or a sum of the first variation and the second variation.

Example 33 comprises the subject matter of any of examples 20-25 or 29-32, including or omitting optional features, wherein the instructions, when executed, further cause the UE to adjust at least one of the positive version or the negative version to compensate for mismatches in at least one of phase or amplitude.

Example 34 is an apparatus configured to generate a complex signal, comprising: IQ-modulation circuitry configured to receive an input data stream and to generate a representation of a complex signal based on the input data stream, wherein the representation comprises an in-phase (I) signal and a quadrature (Q) signal; phase calculation circuitry configured to receive the representation of the complex signal from the IQ-modulation circuitry and to generate, based on the representation, a first angle and a second angle; distributor circuitry configured to receive the second angle from the phase calculation circuitry and to output a positive version of the second angle and a negative version of the second angle; a first signal generator configured to receive the first angle and one of the positive version or the negative version and to generate a first signal based on the first angle and the one of the positive version or the negative version; a second signal generator configured to receive the first angle and the other of the positive version or the negative version and to generate a second signal based on the first angle and the other of the positive version or the negative version; a combiner configured to combine the first signal and the second signal to generate an output signal, wherein the output signal is equivalent to the complex signal; and a power amplifier (PA) configured to amplify the output signal.

Example 35 comprises the subject matter of example 34, wherein the distributor circuitry is configured to select, based on a redirection technique, whether to output the positive version to the first signal generator and the negative version to the second signal generator or to output the positive version to the second signal generator and the negative version to the first signal generator.

Example 36 is a method employable by a user equipment (UE), comprising: receiving a representation of a complex signal; determining a first angle and a second angle based on the complex signal; generating a positive version of the second angle and a negative version of the second angle; selecting a signal generator of a pair of signal generators; receiving the positive version at the selected signal generator and the negative version at the other signal generator of the pair of signal generators; generating a first phasor at the selected signal generator based on the first angle and the positive version; generating a second phasor at the other signal generator based on the first angle and the negative version; and combining the first phasor and the second phasor to obtain an output signal equivalent to the complex signal.

Example 37 comprises the subject matter of example 36, wherein the selecting comprising selecting the signal generator based on a redirection technique.

Example 38 comprises the subject matter of example 37, wherein the redirection technique is based at least in part on an alternating pattern.

Example 39 comprises the subject matter of example 37, wherein the redirection technique is based at least in part on a pseudo-random sequence.

Example 40 comprises the subject matter of example 37, wherein the redirection technique is based at least in part on minimizing one or more of: a first variation from a previous angle output to the selected signal generator, a second variation from a previous angle output to the other signal generator, or a sum of the first variation and the second variation.

Example 41 comprises the subject matter of example 37, wherein at least one of a first path associated with the selected signal generator and a second path associated with the other signal generator have non-ideal characteristics, wherein the redirection technique minimizes the impact of the non-ideal characteristics on the output signal.

Example 42 comprises the subject matter of example 36, further comprising adjusting at least one of the positive version or the negative version to compensate for mismatches in at least one of phase or amplitude.

Example 43 comprises the subject matter of example 42, wherein the adjusting comprises adjusting the at least one of the positive version or the negative version based at least in part on data received via a calibration procedure.

Example 44 comprises the subject matter of example 42, wherein the adjusting comprises adjusting the at least one of the positive version or the negative version based at least in part on data received via a feedback receiver.

Example 45 comprises the subject matter of example 36, further comprising generating the representation based on an input data stream, wherein the representation comprises an in-phase (I) signal and a quadrature (Q) signal.

Example 46 comprises the subject matter of example 36, further comprising amplifying the output signal.

Example 47 is a machine readable medium comprising instructions that, when executed, cause a machine to perform the method of any of examples 36-46.

Example 48 is an apparatus configured to be employed within a transmitter, comprising: means for phase calculation configured to receive a representation of a complex signal and to generate, based on the complex signal, a first angle and a second angle; means for distribution configured to receive the second angle from the means for phase calculation and to output a positive version of the second angle and a negative version of the second angle; first means for digital to time conversion configured to receive the first angle and one of the positive version or the negative version and to generate a first signal based on the first angle and the one of the positive version or the negative version; second means for digital to time conversion configured to receive the first angle and the other of the positive version or the negative version and to generate a second signal based on the first angle and the other of the positive version or the negative version; and means for combining configured to combine the first signal and the second signal to generate an output signal, wherein the output signal is equivalent to the complex signal.

Example 49 is an apparatus configured to generate a complex signal, comprising: means for modulation configured to receive an input data stream and to generate a representation of a complex signal based on the input data stream, wherein the representation comprises an in-phase (I) signal and a quadrature (Q) signal; means for phase calculation configured to receive the representation of the complex signal from the means for modulation and to generate, based on the representation, a first angle and a second angle; means for distribution configured to receive the second angle from the means for phase calculation and to output a positive version of the second angle and a negative version of the second angle; first means for digital to time conversion configured to receive the first angle and one of the positive version or the negative version and to generate a first signal based on the first angle and the one of the positive version or the negative version; second means for digital to time conversion configured to receive the first angle and the other of the positive version or the negative version and to generate a second signal based on the first angle and the other of the positive version or the negative version; means for combining configured to combine the first signal and the second signal to generate an output signal, wherein the output signal is equivalent to the complex signal; and means for amplification configured to amplify the output signal.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. An apparatus configured to be employed within a transmitter, comprising:
   phase circuitry configured to receive a representation of a complex signal and to generate, based on the complex signal, a first angle and a second angle;
   selector circuitry configured to receive the second angle from the phase calculation circuitry and to output a positive version of the second angle and a negative version of the second angle;
   a first signal generator configured to receive the first angle and one of the positive version or the negative version and to generate a first signal based on the first angle and the one of the positive version or the negative version;
   a second signal generator configured to receive the first angle and the other of the positive version or the negative version and to generate a second signal based on the first angle and the other of the positive version or the negative version; and
   a combiner configured to combine the first signal and the second signal to generate an output signal, wherein the output signal is equivalent to the complex signal.

2. The apparatus of claim 1, wherein the distributor circuitry is configured to select, based on a redirection technique, whether to output the positive version to the first signal generator and the negative version to the second signal generator or to output the positive version to the second signal generator and the negative version to the first signal generator.

3. The apparatus of claim 2, wherein the redirection technique is based at least in part on an alternating pattern.

4. The apparatus of claim 2, wherein the redirection technique is based at least in part on a pseudo-random sequence.

5. The apparatus of claim 2, wherein the redirection technique is based at least in part on minimizing one or more of: a first variation from a previous angle output to the first signal generator, a second variation from a previous angle output to the second signal generator, or a sum of the first variation and the second variation.

6. The apparatus of claim 2, wherein at least one of a first path associated with the first signal generator and a second path associated with the second signal generator have non-ideal characteristics, wherein the redirection technique minimizes the impact of the non-ideal characteristics on the output signal.

7. The apparatus of claim 1, wherein the distribution circuitry comprises compensation circuitry configured to adjust at least one of the positive version or the negative version to compensate for mismatches in at least one of phase or amplitude.

8. The apparatus of claim 7, wherein the compensation circuitry is configured to adjust the at least one of the positive version or the negative version based at least in part on data received via a calibration procedure.

9. The apparatus of claim 7, wherein the compensation circuitry is configured to adjust the at least one of the positive version or the negative version based at least in part on data received via a feedback receiver.

10. The apparatus of claim 1, wherein the representation of the complex signal comprises an in-phase (I) signal and a quadrature (Q) signal.

11. The apparatus of claim 10, further comprising IQ-modulation circuitry configured to generate the I signal and the Q signal based on an input data stream.

12. The apparatus of claim 1, further comprising a power amplifier (PA) configured to amplify the output signal.

13. A non-transitory machine readable medium comprising instructions that, when executed, cause a user equipment (UE) to:
   receive a representation of a complex signal;
   determine a first angle and a second angle based on the complex signal;
   generate a positive version of the second angle and a negative version of the second angle;
   select a signal generator of a pair of signal generators;
   receive the positive version at the selected signal generator and the negative version at the other signal generator of the pair of signal generators;
   generate a first phasor at the selected signal generator based on the first angle and the positive version;
   generate a second phasor at the other signal generator based on the first angle and the negative version; and
   combine the first phasor and the second phasor to obtain an output signal equivalent to the complex signal.

14. The non-transitory machine readable medium of claim 13, wherein the instructions, when executed, cause the UE to select the signal generator based on a redirection technique.

15. The non-transitory machine readable medium of claim 14, wherein the redirection technique is based at least in part on an alternating pattern.

16. The non-transitory machine readable medium of claim 14, wherein the redirection technique is based at least in part on a pseudo-random sequence.

17. The non-transitory machine readable medium of claim 14, wherein the redirection technique is based at least in part on minimizing one or more of: a first variation from a previous angle output to the selected signal generator, a second variation from a previous angle output to the other signal generator, or a sum of the first variation and the second variation.

18. The non-transitory machine readable medium of claim 14, wherein at least one of a first path associated with the selected signal generator and a second path associated with the other signal generator have non-ideal characteristics, wherein the redirection technique minimizes the impact of the non-ideal characteristics on the output signal.

19. The non-transitory machine readable medium of claim 13, wherein the instructions, when executed, further cause the UE to adjust at least one of the positive version or the negative version to compensate for mismatches in at least one of phase or amplitude.

20. The non-transitory machine readable medium of claim 19, wherein the instructions, when executed, cause the UE to adjust the at least one of the positive version or the negative version based at least in part on data received via a calibration procedure.

21. The non-transitory machine readable medium of claim 19, wherein the instructions, when executed, cause the UE to adjust the at least one of the positive version or the negative version based at least in part on data received via a feedback receiver.

22. The non-transitory machine readable medium of claim 13, wherein the instructions, when executed, further cause the UE to generate the representation based on an input data stream, wherein the representation comprises an in-phase (I) signal and a quadrature (Q) signal.

23. The non-transitory machine readable medium of claim 13, wherein the instructions, when executed, further cause the UE to amplify the output signal.

24. An apparatus configured to generate a complex signal, comprising:

IQ-modulation circuitry configured to receive an input data stream and to generate a representation of a complex signal based on the input data stream, wherein the representation comprises an in-phase (I) signal and a quadrature (Q) signal;

phase circuitry configured to receive the representation of the complex signal from the IQ-modulation circuitry and to generate, based on the representation, a first angle and a second angle;

selector circuitry configured to receive the second angle from the phase calculation circuitry and to output a positive version of the second angle and a negative version of the second angle;

a first signal generator configured to receive the first angle and one of the positive version or the negative version and to generate a first signal based on the first angle and the one of the positive version or the negative version;

a second signal generator configured to receive the first angle and the other of the positive version or the negative version and to generate a second signal based on the first angle and the other of the positive version or the negative version;

a combiner configured to combine the first signal and the second signal to generate an output signal, wherein the output signal is equivalent to the complex signal; and a power amplifier (PA) configured to amplify the output signal.

25. The apparatus of claim 24, wherein the distributor circuitry is configured to select, based on a redirection technique, whether to output the positive version to the first signal generator and the negative version to the second signal generator or to output the positive version to the second signal generator and the negative version to the first signal generator.

* * * * *